United States Patent
Yang et al.

(10) Patent No.: US 11,842,828 B2
(45) Date of Patent: Dec. 12, 2023

(54) COATINGS AND PROCESSING OF TRANSPARENT CONDUCTIVE FILMS FOR STABILIZATION OF SPARSE METAL CONDUCTIVE LAYERS

(71) Applicant: C3Nano Inc., Hayward, CA (US)

(72) Inventors: Xiqiang Yang, Hayward, CA (US); Ajay Virkar, San Mateo, CA (US)

(73) Assignee: C3 Nano, Inc., Hayward, CA (US)

(*) Notice: Subject to any disclaimer, the term of this patent is extended or adjusted under 35 U.S.C. 154(b) by 197 days.

(21) Appl. No.: 16/950,246

(22) Filed: Nov. 17, 2020

(65) Prior Publication Data

US 2021/0151216 A1     May 20, 2021

Related U.S. Application Data

(60) Provisional application No. 62/936,681, filed on Nov. 18, 2019.

(51) Int. Cl.
    *H01B 5/14*          (2006.01)
    *H01B 1/22*          (2006.01)
    *B29D 11/00*        (2006.01)

(52) U.S. Cl.
    CPC .......... *H01B 5/14* (2013.01); *B29D 11/00788* (2013.01); *H01B 1/22* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 3,008,858 A | 11/1961 | Blake et al. | |
| 3,088,849 A | 5/1963 | Friedlander | |
| 4,012,399 A | 3/1977 | Hechenbleikner et al. | |
| 4,087,406 A | 5/1978 | Ramey et al. | |

(Continued)

FOREIGN PATENT DOCUMENTS

| | | |
|---|---|---|
| CN | 100335520 C | 9/2007 |
| JP | 2004-053685 A | 2/2004 |

(Continued)

OTHER PUBLICATIONS

Chang et al., "Highly foldable transparent conductive films composed of silver nanowire junctions prepared by chemical metal reduction", Nanotechnology, vol. 25, p. 1-7, (2014).

(Continued)

*Primary Examiner* — Katie L. Hammer
(74) *Attorney, Agent, or Firm* — Christensen, Fonder, Dardi; Elizabeth A. Gallo; Peter S. Dardi

(57) ABSTRACT

Transparent conductive films comprising sparse metal conductive layers are processed after coating with an overcoat to lower the sheet resistance of the film. The sparse metal conductive layer can comprise a fused metal nanostructured network. A coating, such as a polymer overcoat or a polymer undercoat can noble metal ions that can further reduce the sheet resistance with the application of heat and optionally humidity. In particular, silver ions in a coating are demonstrated to provide important stabilization of sparse metal conductive layers, whether or not fused, upon the application of heat and humidity. A coating can further comprise a metal salt stabilization composition.

9 Claims, 6 Drawing Sheets

(56) References Cited

U.S. PATENT DOCUMENTS

| | | |
|---|---|---|
| 4,348,462 A | 9/1982 | Chung |
| 4,734,449 A | 3/1988 | Gugumus |
| 4,994,511 A | 2/1991 | Klutz |
| 5,258,225 A | 11/1993 | Katsamberis |
| 5,565,501 A | 10/1996 | Hosokawa et al. |
| 6,353,042 B1 | 3/2002 | Hanoka et al. |
| 6,629,833 B1 | 10/2003 | Ohya et al. |
| 8,026,042 B2 | 9/2011 | Kim et al. |
| 8,049,333 B2 | 11/2011 | Alden et al. |
| 8,183,195 B2 | 5/2012 | Westwood |
| 9,150,746 B1 | 10/2015 | Li et al. |
| 9,183,968 B1 | 11/2015 | Li et al. |
| 9,920,207 B2 | 3/2018 | Virkar et al. |
| 10,020,807 B2 | 7/2018 | Virkar et al. |
| 10,029,916 B2 | 7/2018 | Virkar et al. |
| 10,714,230 B2 | 7/2020 | Hu et al. |
| 2004/0033369 A1 | 2/2004 | Fleming et al. |
| 2004/0229047 A1 | 11/2004 | Gurtler et al. |
| 2005/0062019 A1 | 3/2005 | Yukinobu |
| 2008/0216705 A1 | 9/2008 | Hayes et al. |
| 2008/0286447 A1 | 11/2008 | Alden et al. |
| 2009/0117369 A1 | 5/2009 | Jaworowski et al. |
| 2009/0129004 A1 | 5/2009 | Gruner |
| 2010/0243295 A1* | 9/2010 | Allemand ........... H01L 51/5206 174/250 |
| 2011/0244256 A1 | 10/2011 | Song et al. |
| 2012/0012164 A1 | 1/2012 | Sugiura et al. |
| 2012/0118617 A1* | 5/2012 | Bories-Azeau ......... B32B 27/36 977/762 |
| 2013/0087363 A1 | 4/2013 | Oh et al. |
| 2013/0341074 A1 | 12/2013 | Virkar et al. |
| 2013/0342221 A1 | 12/2013 | Virkar et al. |
| 2014/0202738 A1 | 7/2014 | Allemand et al. |
| 2014/0234618 A1 | 8/2014 | Allemand et al. |
| 2014/0234661 A1 | 8/2014 | Allemand et al. |
| 2014/0238833 A1 | 8/2014 | Virkar et al. |
| 2014/0262454 A1 | 9/2014 | Zou et al. |
| 2014/0377704 A1 | 12/2014 | Mukai et al. |
| 2015/0090573 A1 | 4/2015 | Mansky et al. |
| 2015/0144380 A1 | 5/2015 | Yang et al. |
| 2015/0270024 A1 | 9/2015 | Allemand |
| 2016/0032127 A1 | 2/2016 | Li et al. |
| 2016/0108256 A1 | 4/2016 | Yang et al. |
| 2016/0122562 A1 | 5/2016 | Yang et al. |
| 2016/0293288 A1* | 10/2016 | Hu ........................ H01B 1/22 |
| 2016/0369104 A1 | 12/2016 | Gu et al. |
| 2018/0105704 A1* | 4/2018 | Yang ..................... H01B 1/22 |
| 2020/0245457 A1 | 7/2020 | Chen et al. |

FOREIGN PATENT DOCUMENTS

| | | |
|---|---|---|
| JP | 2014-116353 A | 9/2014 |
| TW | 2008-12730 A | 3/2008 |
| TW | 326297 B | 6/2010 |
| TW | 2014-10811 A | 3/2014 |
| WO | 2013-084873 A1 | 6/2013 |
| WO | 2014-093005 A1 | 6/2014 |
| WO | 2015-143383 A1 | 9/2015 |
| WO | 2016-160759 A1 | 10/2016 |

OTHER PUBLICATIONS

Weiss et al., "Humidity Assisted Annealing Technique for Transparent Conductive Silver Nanowire Networks", RSC Advances, vol. 5, p. 19659-19665, (Feb. 6, 2015).

Zhu et al., "Fused Silver Nanowires with Metal Oxide Nanoparticles and Organic Polymers for Highly Transparent Conductors," ACS Nano, vol. 5, No. 12, (2011); pp. 9877-9882.

* cited by examiner

COATINGS AND PROCESSING OF TRANSPARENT CONDUCTIVE FILMS FOR STABILIZATION OF SPARSE METAL CONDUCTIVE LAYERS

CROSS REFERENCE TO RELATED APPLICATIONS

This application claims priority to U.S. provisional patent application 62/936,681 filed on Nov. 18, 2019 to Yang et al., entitled "Post Coating Processing Of Transparent Conductive Films Formed With Fused Silver Nanowires," incorporated herein by reference.

BACKGROUND OF THE INVENTION

Functional films can provide important functions in a range of contexts. For example, electrically conductive films can be important for the dissipation of static electricity when static can be undesirable or dangerous. Transparent conductive films can be used as electrodes. High quality displays can comprise one or more transparent conductive layers.

Transparent conductors can be used for several optoelectronic applications including, for example, touch-screens, liquid crystal displays (LCD), flat panel display, organic light emitting diode (OLED), solar cells and smart windows. Historically, indium tin oxide (ITO) has been the material of choice due to its relatively high transparency at high conductivities. There are however several shortcomings with ITO. For example, ITO is a brittle ceramic, which needs to be deposited using sputtering, a fabrication process that involves high temperatures and vacuum and therefore is relatively slow and not cost effective. Additionally, ITO is known to crack easily on flexible substrates. Newer portable electronic devices are pushing into thinner formats.

SUMMARY OF THE INVENTION

In a first aspect, the invention pertains to a transparent conductive film comprising a transparent polymer substrate, a sparse metal conductive layer supported by the substrate, and a polymer overcoat adjacent the sparse metal conductive layer, wherein the transparent conductive film has a transmittance of visible light of at least about 88% and a sheet resistance of no more than about 120 ohm/sq and wherein the polymer overcoat comprise polymer and from about 0.01 wt % to about 20 wt % noble metal ions.

In a further aspect, the invention pertains to a method for lowering sheet resistance of a transparent conductive film comprising a substrate, a transparent conductive layer and a polymer overcoat, the transparent conductive layer comprising a fused metal nanowire network and polymeric polyol binder, wherein the polymer overcoat has an average thickness from about 5 nm to about 250 nm, the method comprising the step heating the transparent conductive sheet to a temperature of at least about 55° C. for at least about 10 minutes to lower the sheet resistance by at least about 5%. The heating step can be performed in a structure free of an optically clear adhesive. In some embodiments, the fused metal nanostructured network comprises silver, and the film has a sheet resistance of no more than 120 ohms/sq and a transmittance of visible light of at least about 88%.

In another aspect, the invention pertains to a transparent conductive film comprising a substrate, a transparent conductive layer comprising a fused metal nanostructured network and a polymer overcoat, wherein the transparent conductive film has a transmittance of at least about 88% and a sheet resistance of no more than about 120 ohm/sq, wherein the transparent conductive film has a been modified through processing for at least about 10 minutes with heat and optionally humidity to decrease the sheet resistance at least about 5%. In some embodiments, the polymer overcoat and/or an undercoat comprises metal ions. The metal ions can comprise silver ions in a concentration from about from about 0.01 wt % to about 20 wt %. In additional or alternative embodiments, the metal ions comprise vanadium (+5) in a concentration from about 0.5 wt % to about 5 wt %. In some embodiments, the fused metal nanostructured network comprises silver, and the processing comprises heating at a temperature from about 60° C. to about 100° C., at a relative humidity of at least about 60% while the transparent conduct film is free of an optically clear adhesive. The overcoat can have an average thickness from about 5 nm to about 250 nm and can comprises crosslinked polyacrylate and vanadium (+5) ions in a concentration from about 0.5 wt % to about 5 wt %.

DETAILED DESCRIPTION

Figure 1:
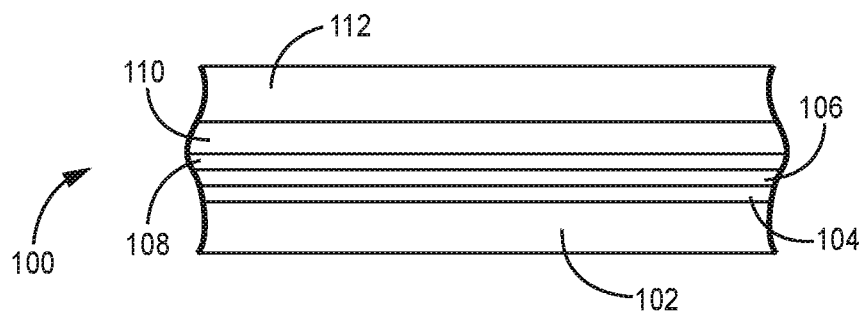
FIG. 1 is a fragmentary side view of a film with a sparse metal conductive layer and various additional transparent layers on either side of the sparse metal conductive layer.

As demonstrated herein, controlled application of heat, optionally with added humidity, can be used to lower sheet resistance of a fused metal nanostructured network with a protective polymer overcoat. This processing can be applied to sheets of transparent conductive films with a protective polymer overcoat to further enhance electrical performance. This processing can be effective for fused metal nanostructured networks in which deposited metal has been directed to joints between metal nanowires. It is further discovered that placement of noble metal ions, in particular silver, into a polymer coating, such as an overcoat, adjacent a sparse metal conductive layer, such as the fused metal nanostructured network, are suitable to further stabilize the conductive structure. With the noble metals in a coating, the advantages do not necessarily need additional processing to exploit since the benefits may result during use. If the sparse metal conductive layer does not comprise a fused metal nanostructured network, the results in the present Examples suggest that significant stabilization resulting from noble metal ions in the overcoat has a profound effect on stability under light and humidity, possibly due to fusing with metal ions from the overcoat. Results are demonstrated with silver-based conductors. The transparent, electrically conductive films can have high transmittance and low haze. The process times and conditions can be controlled to avoid significant degradation while achieving performance enhancement. Similarly, following processing, the film exhibits significantly enhanced stability under accelerated wear conditions also at high temperature and humidity. The processing can be adapted for use with films formed using roll-to-roll processing for large-scale commercial applications.

Dispersions or inks of silver nanowires can be deposited on a surface and processed into a conductive film. Under appropriate process conditions, a resulting transparent conductive film can be desirable due to its mechanical properties, transparency to visible light, flexibility, combinations of these features, or other aspects of the conductive film. In particular, the use of the nanowires to form transparent conductive films can have significant application in devices with displays and touch sensors.

Transparent electrically conductive elements, e.g., films, based on metal comprise a sparse metal conductive layer. The conductive layers are generally sparse to provide desired amount of optical transparency through the conductive structure rather than around the conductive structure, so the coverage of the metal generally has significant, although microscopic, gaps over the layer of the conductive element. For example, transparent electrically conductive films can comprise metal nanowires deposited along a layer where sufficient contact can be provided for electron percolation to provide suitable conduction pathways. In embodiments of particular interest, the transparent electrically conductive film can comprise a fused metal nanostructured network, which has been found to exhibit desirable electrical and optical properties. Conductivity referenced herein refers to electrical conductivity unless specifically indicated otherwise.

As explained in more detail below, the fusing process can be controlled to carefully deposit metal at junctions between the metal nanowires. The fusing process can be controlled to deposit a desired amount of silver associated with the junctions. The systems can be poised to provide for thermodynamic driving of the fusing to take place primarily at the junctions between neighboring metal nanowires that are components that are formed into the fused metal nanostructured network. Following fusing, a unitary structure is formed that has been named a fused metal nanostructured network, and the original metal nanowires within the conductive structure lose their individual identity. Evidence suggests that the fusing metal merges the original individual nanowires to reduce or eliminate junction resistance. For commercial products, it is desirable to improve the durability of the transparent conductive films under a range of real world conditions, and the processing described herein is demonstrated to improve the durability under specific accelerated wear testing.

The advantages of forming a fused metal nanostructured network are still being fully understood in the context of silver nanowire-based transparent conductors. The fusing process to form a fused metal nanostructured network has been found to result in highly transparent and highly conductive structures with very low haze. The fused metal nanostructured networks have very good stability under accelerated wear conductions using appropriate stabilizers. The addition of noble metal ions, such as silver, in the overcoat provides an additional level of stabilization, and the results suggest that for the present binder systems used herein with a hydrophilic binder in the transparent conductive layer, that fusing and/or noble metal ions in the overcoat are needed to obtain reasonable stability under established heat and humidity testing.

For commercial processing, a thin protective polymer overcoat is generally placed over the transparent conductive layer. The protective coating generally has a thickness of no more than about 250 nm. As the results below demonstrate, when the transparent conductive films with fused metal nanostructured networks and a protective polymer overcoat are subjected to heat and optionally with humidity, the sheet resistance is observed to drop prior to eventual increase due to degradation. Similar drop in resistance is not observed with corresponding films that are not fused. As a result, the structure with the fused metal nanostructured network can be found to be more stable than structures previously tested under corresponding conditions. It is possible that the thermal processing further supports improvement in the fusing process. The introduction of humidity during the thermal processing can effectuate a greater decrease in the sheet resistance.

It has previously been observed that use of humidity during the fusing process can allow for the use of lower temperatures and shorter process time to obtain comparable values of the sheet resistance. See U.S. Pat. No. 9,183,968B, to Li et al., entitled "Metal Nanowire Inks for the Formation of Transparent Conductive Films with Fused Networks," incorporated herein by reference. This observation may or may not be related to the current observations. The time frames of the current processing are much longer than used in the standard fusing process.

Heat and/or humidity can swell the polymer binder around the conductive elements if the polymer is hydrophilic. If the conductive elements are not fused, a swelling of the binder can reduce the conductivity and increase sheet resistance due to a reduction of the contact between the conductive elements. With a fused metal nanostructured network, the fused elements are bonded. While not wanting to be limited by theory, then the swelling can facilitate migration of metal nanoparticles or any residual metal ions to facilitate in the fusing of the junctions, which can further reduce sheet resistance. The drop in sheet resistance is observed in the Examples below. Similarly, if the overcoat has metal ions, these can migrate over time to further contribute to junction fusing, which can mitigate damage and result in further drop in sheet resistance.

The structure following the thermal processing with heat with the protective polymer overcoat may or may not be qualitatively different from prior formed structures. Nevertheless, the results observed are consistent with further migration of silver to the fused metal nanostructured network, so that the structure overall would seem to have less nanoparticles scattering and absorbing light away from the fused metal nanostructured network. To the extent that a new structure is formed, it follows from the studies that the new structure achieves improved stability during thermal testing, while optical properties generally are maintained or improved.

The data presented herein provides both data related to the process to improve the electrical conductivity and simultaneously data on the wear testing of the transparent conductive film. Wear test improvements can be achieved through post processing after application of the polymer overcoat and/or over time with the addition of metal ions into the overcoat. Presumably, if the process is stopped once the sheet resistance reaches a lower value, this material could be used to form products with lower sheet resistance and desirable stability. In general, the post-processed transparent conductive films can have a sheet resistance at least about 5% lower, in some embodiments at least about 7.5% lower and in other embodiments at least about 10% lower relative to the initial sheet resistance values following fusing.

With respect to change of environmental stability, we consider two ways to evaluate this parameter. In a straightforward sense, the initial samples can be considered. Again, these samples involve a thin protective polymer overcoat. These initial samples can exhibit treatment at 65° C. and 90% relative humidity and maintain a ratio of sheet resistance divided by initial sheet resistance ($R/R_0$) less than 1.2 (referred to as 65/90 stability) for at least about 200 hours, in some embodiments at least about 300 hours, and in further embodiments at least about 400 hours. If the heat treated material that exhibits the lower values of sheet resistance is a new material by virtue of previously un-obtained structural modification, one can reference the heat stability times observed with the modified material relative to the heat stability times of the initial material.

Results are presented where the heating is performed at 85° C. with ambient humidity, at 85° C. and 85% relative humidity and at 65° C. and 90% relative humidity. Generally, the processing to form the modified material can be performed over times from about 10 minutes to about 100 hours depending on the process conditions in terms of temperature and relative humidity. If a new material is formed, the processing to form such new material presumably can be optimized.

Silver provides excellent electrical conductivity. The present applicant markets silver nanowire inks for forming fused metal nanostructured networks under the tradename ActiveGrid® ink. Other silver nanowire sources are commercially available, and the basic fusing technology is well described in the '207 and '807 patents cited below. The vast majority (>98%) of silver nanowires in the Generation 5 (GEN5) ActiveGrid® product have diameters below <25 nm, and the vast majority (>98%) of silver nanowires in generation 7 (GEN7) ActiveGrid® silver nanowire diameter of <22 nm. The synthesis of thin silver nanowires is described in U.S. Pat. No. 10,714,230 B2 to Hu et al., entitled "Thin and Uniform Silver Nanowires, Methods of Synthesis and Transparent Conductive Films Formed from the Nanowires," incorporated herein by reference.

Improved properties have been found for fused metal nanostructured networks with respect to high electrical conductivity and desirable optical properties with respect to transparency and low haze. Fusing of adjacent metal nanowires can be performed based on chemical processes under commercially appropriate processing conditions.

In particular, a significant advance with respect to achieving electrically conductive films based on metal nanowires has been the discovery of well controllable processes to form a fused metal network where adjacent sections of the metal nanowires fuse into a unitary structure without distinct nanowires in the conductive network. In particular, it was initially discovered that halide ions can drive the fusing of metal nanowires to form fused metal nanostructures. Fusing agents comprising halide anions were introduced in various ways to successfully achieve the fusing with a corresponding significant drop in the electrical resistance. It should be noted that halide ions in this processing context should not be confused with halide ions used in the nanowire synthesis reactions. Specifically, the fusing of metal nanowires with halide anions has been accomplished with vapors and/or solutions of acid halides as well as with solutions of halide salts. Fusing of metal nanowires with halide sources is described further in U.S. Pat. No. 10,029,916 to Virkar et al., entitled "Metal Nanowire Networks and Transparent Conductive Material," and U.S. Pat. No. 9,920,207 to Virkar et al. (the '207 patent), entitled "Metal Nanostructured Networks and Transparent Conductive Material," both of which are incorporated herein by reference.

An extension of the process for forming fused metal nanowire networks was based on reduction/oxidation (redox) reactions that can be provided to result in fused nanowires without destroying the optical properties of the resulting film. Metal for deposition at the junctions can be effectively added as a dissolved metal salt or can be dissolved from the metal nanowires themselves. The effective use of redox chemistry for fusing metal nanowires into a nanostructured network is described further in U.S. Pat. No. 10,020,807 to Virkar et al. (the '807 patent), entitled "Fused Metal Nanostructured Networks, Fusing Solutions with Reducing Agents and Methods for Forming Metal Networks," incorporated herein by reference. The '807 patent also described a single solution approach for the formation of fused metal nanostructured networks. Single solution approaches for the formation of fused metal nanostructured layers are described further in U.S. Pat. No. 9,183,968 B1 to Li et al, (hereinafter the '968 patent) entitled "Metal Nanowire Inks for the Formation of Transparent Conductive Films with Fused Networks," incorporated herein by reference, and single solution or ink processing to form fused metal nanostructured networks is used in the Examples below.

The desirable inks to achieve effective single deposition inks that cure into fused nanostructured metal networks comprise a desired amount of metal nanowires to achieve appropriate loading of metal in the resulting film. In appropriate solutions, the inks are stable prior to deposition of the ink and drying. The inks can comprise a reasonable amount of polymer binder that contributes to the formation of a stable conducting film for further processing. To obtain good fusing results with one ink systems, hydrophilic polymers have been found to be effective as binders, such as cellulose or chitosan based polymers. Metal ions, as a source of metal for the fusing process, can be supplied as a soluble metal salt.

A single ink formulation provides for depositing a desired loading of metal as a film on the substrate surface and simultaneously providing constituents in the ink that induce the fusing process as the ink is dried under appropriate conditions. These inks can be referred to conveniently as fusing metal nanowire inks with the understanding that the fusing generally does not take place until drying. The inks generally comprise an aqueous solvent, which can further comprise an alcohol and/or other organic solvent in some embodiments. The inks can further comprise dissolved metal salts as a metal source for the fusing process. Without wanting to be limited by theory, it is believed that components of the ink, e.g., alcohol, or other organic compositions, reduce the metal ions from solution to drive the fusing process. Previous experience with the fusing process in these systems suggests that the metal preferentially deposits at the junctions between adjacent metal nanowires. A polymer binder can be provided to stabilize the film and to influence ink properties. The particular formulation of the ink can be adjusted to select ink properties suitable for a particular deposition approach and with specific coating properties on a substrate surface. As described further below, drying conditions can be selected to effectively perform the fusing process.

In general, one or more solutions or inks for the formation of the metal nanostructured network can collectively comprise well dispersed metal nanowires, a fusing agent, and optional additional components, for example, a polymer binder, a crosslinking agent, a wetting agent, e.g., a surfactant, a thickener, a dispersant, other optional additives or combinations thereof. The solvent for the metal nanowire ink and/or the fusing solution if distinct from the nanowire ink can comprise an aqueous solvent, an organic solvent or mixtures thereof. In particular, suitable solvents include, for example, water, alcohols, ketones, esters, ethers, such as glycol ethers, aromatic compounds, alkanes, and the like and mixtures thereof. Specific solvents include, for example, water, ethanol, isopropyl alcohol, isobutyl alcohol, tertiary butyl alcohol, methyl ethyl ketone, glycol ethers, methyl isobutyl ketone, toluene, hexane, ethyl acetate, butyl acetate, ethyl lactate, PGMEA (2-methoxy-1-methylethylacetate), dimethyl carbonate, or mixtures thereof. While the solvent should be selected based on the ability to form a good dispersion of metal nanowires, the solvents should also be compatible with the other selected additives so that the additives are soluble in the solvent. For embodiments in which the fusing agent is included in a single solution with the metal nanowires, the solvent or a component thereof may or may not be a significant component of the fusing solution, such as alcohols and can be selected accordingly if desired.

The metal nanowire ink, in either a one ink or two ink configuration, can include from about 0.01 to about 1 weight percent metal nanowires, in further embodiments from about 0.02 to about 0.75 weight percent metal nanowires and in additional embodiments from about 0.04 to about 0.5 weight percent metal nanowires. For embodiments of particular interest, the nanowires are silver nanowires and the metal ion source is a dissolved silver salt. The ink can comprise silver ions in a concentration from about 0.01 mg/mL and about 2.0 mg/mL silver ions, in further embodiments from about 0.02 mg/mL and about 1.75 mg/mL and in other embodiments from about 0.025 mg/mL and about 1.5 mg/mL. A person of ordinary skill in the art will recognize that additional ranges of metal nanowire concentrations and metal ion concentrations within the explicit ranges above are contemplated and are within the present disclosure. The concentration of metal nanowires influences the loading of metal on the substrate surface as well as the physical properties of the ink.

With respect to the ink formulation, polymer binders and the solvents are generally selected consistently such that the polymer binder is soluble or dispersible in the solvent. In appropriate embodiments, the metal nanowire ink generally comprises from about 0.02 to about 5 weight percent binder, in further embodiments from about 0.05 to about 4 weight percent binder and in additional embodiments from about 0.1 to about 2.5 weight percent polymer binder. In some embodiments, the polymer binder comprises a crosslinkable organic polymer, such as a radiation crosslinkable organic polymer and/or a heat curable organic binder. Desired binders include, for example, polymeric polyols, such as polysaccharides-cellulose based polymers, chitosan based polymers and the like. To facilitate the crosslinking of the binder, the metal nanowire ink can comprise in some embodiments from about 0.0005 wt % to about 1 wt % of a crosslinking agent, in further embodiments from about 0.002 wt % to about 0.5 wt % and in additional embodiments from about 0.005 wt % to about 0.25 wt %. The nanowire ink can optionally comprise a rheology modifying agent or combinations thereof. In some embodiments, the ink can comprise a wetting agent or surfactant to lower the surface tension, and a wetting agent can be useful to improve coating properties. A wide range of surfactants, such as nonionic surfactants, cationic surfactant, anionic surfactants, zwitterionic surfactants, are commercially available. The wetting agent generally is soluble in the solvent. In some embodiments, the nanowire ink can comprise from about 0.001 weight percent to about 1 weight percent wetting agent, in further embodiments from about 0.002 to about 0.75 weight percent and in other embodiments from about 0.003 to about 0.6 weight percent wetting agent. A thickener can be used optionally as a rheology modifying agent to stabilize the dispersion and reduce or eliminate settling. In some embodiments, the nanowire ink can comprise optionally from about 0.05 to about 5 weight percent thickener, in further embodiments from about 0.075 to about 4 weight percent and in other embodiments from about 0.1 to about 3 weight percent thickener. A person of ordinary skill in the art will recognize that additional ranges of binder, wetting agent and thickening agent concentrations within the explicit ranges above are contemplated and are within the present disclosure.

The stability of the transparent conductive layers is a significant consideration for the adoption of these structures into commercial devices, such as smart phones, tablets, computer touch screens, large format touch screens, foldable electronics, wearable electronics and the like. The reliability of the touch sensors formed with transparent conductive layers is significant for wide spread commercial adoption, and broader ranges of devices can be accessed with greater reliability of the materials. The processing and structures described herein provide for even greater commercial viability for structures that have already found adoption in commercial devices.

Transparent Conductive Film Structure

Referring to FIG. 1, representative transparent conductive film 100 comprises a substrate 102, optional undercoat layer 104, sparse metal conductive layer 106, overcoat layer 108, optically clear adhesive layer 110 and protective surface layer 112, although not all embodiments include all layers. Generally, optically clear adhesive layer 110 and protective surface layer 112 would be added after completion of significant processing described herein to improve stability of the transparent conductive layer(s). A transparent conductive film generally comprises a sparse metal conductive layer and at least one layer on each side of the sparse metal conductive layer. The total thickness of the transparent conductive film can generally have an average thickness from 5 microns to about 2 millimeters (mm), in further embodiments from about 10 microns to about 1 mm and in other embodiments from about 12 microns to about 0.5 mm. A person of ordinary skill in the art will recognize that additional ranges of thicknesses within the explicit ranges above are contemplated and are within the present disclosure. In some embodiments, the length and width of the film as produced can be selected to be appropriate for a specific application so that the film can be directly introduced for further processing into a product. In additional or alternative embodiments, a width of the film can be selected for a specific application, while the length of the film can be long with the expectation that the film can be cut to a desired length for use. For example, the film can be in long sheets or a roll. Similarly, in some embodiments, the film can be on a roll or in another large standard format and elements of the film can be cut according to a desired length and width for use.

Substrate 102 generally comprises a durable support layer formed from an appropriate polymer or polymers. In some embodiments, the substrate can have an average thickness from about 1 microns to about 1.5 mm, in further embodiments from about 5 microns to about 1 mm and in additional embodiments from about 10 microns to about 100 microns. In particular for foldable structures, especially double sided foldable structures described below, the substrate thickness is generally no more than about 27 microns and in further embodiments from about 5 microns to about 25 microns, A person of ordinary skill in the art will recognize that additional ranges of thicknesses of the substrate within the explicit ranges above are contemplated and are within the present disclosure. Suitable optically clear polymers with very good transparency, low haze and good protective abilities can be used for the substrate.

Suitable polymers for the substrate include, for example, polyethylene terephthalate (PET), polyethylene naphthalate (PEN), polyacrylate, poly(methyl methacrylate), polyolefin, polyvinyl chloride, fluoropolymers, polyamide, polyimide, polysulfone, polysiloxane, polyetheretherketone, polynorbornene, polyester, polystyrene, polyurethane, polyvinyl alcohol, polyvinyl acetate, acrylonitrile-butadiene-styrene copolymer, cyclic olefin polymer, cyclic olefin copolymer, polycarbonate, copolymers thereof or blend thereof or the like. Suitable commercial polycarbonate substrates include, for example, MAKROFOL SR243 1-1 CG, commercially available from Bayer Material Science; TAP® Plastic, commercially available from TAP Plastics; and LEXAN™ 8010CDE, commercially available from SABIC Innovative Plastics. Protective surface layer 112 can independently have a thickness and composition covering the same thickness ranges and composition ranges as the substrate as described in this paragraph above.

The amount of nanowires delivered onto the substrate for sparse metal conductive layer 106 can involve a balance of factors to achieve desired amounts of transparency and electrical conductivity. While thickness of the nanowire network can in principle be evaluated using scanning electron microscopy, the network can be relatively sparse to provide for optical transparency, which can complicate the measurement. In general, the sparse metal conductive structure, e.g., fused metal nanowire network, would have an average thickness of no more than about 5 microns, in further embodiments no more than about 2 microns and in other embodiments from about 10 nm to about 500 nm. However, the sparse metal conductive structures are generally relatively open structures with significant surface texture on a submicron scale. The loading levels of the nanowires can provide a useful parameter of the network that can be readily evaluated, and the loading value provides an alternative parameter related to thickness. Thus, as used herein, loading levels of nanowires onto the substrate is generally presented as milligrams of nanowires for a square meter of substrate. In general, the nanowire networks can have a loading from about 0.1 milligrams (mg)/m$^2$ to about 300 mg/m$^2$, in further embodiments from about 0.5 mg/m$^2$ to about 200 mg/m$^2$, and in other embodiments from about 1 mg/m$^2$ to about 150 mg/m$^2$. A person of ordinary skill in the art will recognize that additional ranges of thickness and loading within the explicit ranges above are contemplated and are within the present disclosure. If the sparse metal conductive layer is patterned, the thickness and loading discussion applies only to the regions where metal is not excluded or significantly diminished by the patterning process.

Figure 2:
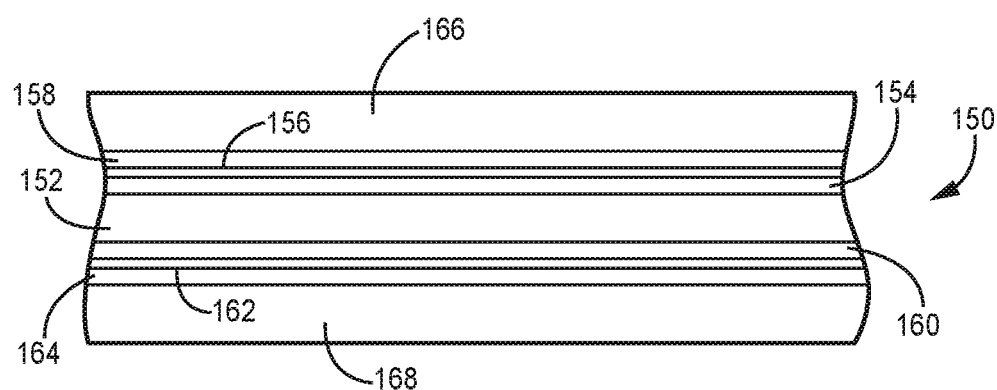
FIG. 2 is a schematic side view of a double-sided structure with a sparse metal conductive layer with on each side of a thin polymer substrate.

For structures with double-sided separately patternable transparent conductive layers, UV absorbing transparent substrates can be used, such a structure is shown in FIG. 2, which is described below. For these embodiments in particular, although useful for all embodiments, suitable polymers include, for example, polyimides, polysulfide (such as Pylux™, Ares Materials), polysulfone (such as Udel® from Solvay), or polyethersulfone (such as Veradel® from Solvay or Ultrason® from BASF), and polyethylene naphthalate (such as Teonex® from DuPont). Examples are presented below based on transparent polyimides. Traditional aromatic polyimides are colored. But recently developed polyimides are transparent to visible light. The transparent polyimides absorb ultra violet light. Transparent polyimides are available from Kolon (Korea), Taimide Tech. (Taiwan), Sumitomo (Japan), SKC Inc. (GA, USA) and NeXolve (AL, USA).

Optional undercoat 104 and/or overcoat 108 can be placed respectively under or over sparse metal conductive layer 106. Coatings 104, 108 can comprise a curable polymer, e.g., heat curable or radiation curable polymers. Coatings 104, 108 can have an average thickness as described in the following section specifically covering overcoats and undercoats. The thickness and compositions of the overcoat can be selected such that the sheet resistance measurement through the overcoat is not significantly altered relative to the measurement without the overcoat. Coatings 104, 108 can comprise significant additives for stabilizing the conductive layer, which is described more below. Suitable coating polymers are described below.

Optional optically clear adhesive layer 110 can have an average thickness from about 10 microns to about 300 microns, in further embodiments from about 15 microns to about 250 microns and in other embodiments from about 20 microns to about 200 microns. A person of ordinary skill in the art will recognize that additional ranges of thicknesses of optically clear adhesive layers within the explicit ranges above are contemplated and are within the present disclosure. Suitable optically clear adhesives can be contact adhesives. Optically clear adhesives include, for example, coatable compositions and adhesive tapes. Optically clear adhesive tapes can be double sticky tapes with a carrier film between two adhesive layers, see for example 3M 8173KCL. UV curable liquid optically clear adhesives are available based on acrylic or polysiloxane chemistries. Suitable adhesive tapes are available commercially, for example, from Lintec Corporation (MO series); Saint Gobain Performance Plastics (DF713 series); Nitto Americas (Nitto Denko) (LUCIACS CS9621T and LUCIAS CS9622T); LG Hausys OCA (OC9102D, OC9052D); DIC Corporation (DAITAC LT series OCA, DAITAC WS series OCA and DAITAC ZB series); PANAC Plastic Film Company (PANACLEAN series); Minnesota Mining and Manufacturing (3M, Minnesota U.S.A.—product numbers 8146, 8171, 8172, 8173, 9894, and similar products) and Adhesive Research (for example product 8932).

Some optically clear adhesive tapes comprise a carrier film, such as a polyethylene terephthalate (PET), which can be embedded in the tape between two adhesive surfaces. Based on earlier work with organic stabilization agents, it was discovered that the presence of a carrier film in the optically clear adhesive lay was effective in combination with those stabilization agents to improve the stabilizing properties of an optically clear adhesive tape relative to corresponding films with optically clear adhesive tapes without carrier films. While not wanting to be limited by theory, the improvement in stability was speculated to be potentially due to decreased water and oxygen permeability through the carrier film. Using the metal-based stabilization agents described herein, the stabilization properties are found not to significantly depend on the specific optically clear adhesives used, which is an advantage of the metal-based stabilization agents, such as the V(+5) salts.

An embodiment of a double-sided structure with two transparent conductive structures is shown in FIG. 2. FIG. 2 shows the general structure of a double-sided conductive element in a unitary form on a core substrate. Referring to FIG. 2, double-sided conductive sheet 150 can comprise substrate polymer sheet 152, optional first hardcoat 154, first sparse metal conductive layer 156, first overcoat 158, optional second hardcoat 160, second sparse metal conductive layer 162, second overcoat 164, optional first releasable protective film 166, and optional second releasable protective film 168.

Figure 3:
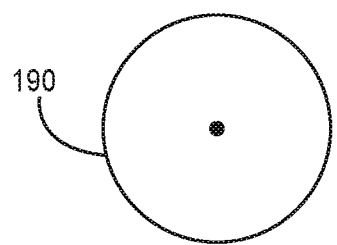
FIG. 3 is a schematic side view of a roll of transparent conductive film.

Either the one sided or the two sided sheet with the transparent conductive layers can be produced in a roll-to-roll format. Such a roll 190 is shown schematically in FIG. 3. The formation of double sided flexible structures in a roll-to-roll format is described in published U.S. patent application 2020/0245457 to Chen et al., entitled "Thin Flexible Structures With Transparent Conductive Films and Processes for Forming the Structures," incorporated herein by reference.

In general, the silver nanowire inks can be applied using any reasonable approach, such as dip coating, spray coating, knife edge coating, bar coating, Meyer-rod coating, slot-die coating, gravure printing, spin coating or the like. For commercial roll-to-roll processing, slot-die coating generally is used. The films can be dried, for example, with a heat gun, an oven, a thermal lamp, flow of warm air, or the like. In some embodiments, the films can be heated to temperatures from about 50° C. to about 150° C. during drying. To facilitate the fusing process, the delivery of heat is generally continued for about 30 seconds to about fifteen minutes. A person of ordinary skill in the art will recognize that additional ranges of temperatures and times within the explicit ranges above are contemplated and are within the present disclosure.

The transparent conductive films can be used for a range of products incorporating transparent conductive electrodes, such as solar cells. The excellent optical properties make the transparent conductive films particularly valuable for use in touch sensors integrated into displays. The transparent conductive layers can be patterned using photolithography, laser ablation or other suitable technique. Patterned transparent conductive layers can be suitable form forming touch sensors. Such touch sensors are finding application in portable electronics as well as in large format displays.

Polymer Coatings (Overcoat and/or Undercoat)

Polymer coatings can provide desirable functionality and are generally described above in the context of the overall structures. In particular, a polymer overcoat provides several functions. First, it provides mechanical protection for the transparent conductive layer during further processing. Second, it can be provided with a stabilization composition to improve wear endurance for the transparent conductive layer. An undercoat can provide a desirable surface for placement of the transparent conductive layer with the fused metal nanostructured network and can provide stabilization compositions. As described herein, the inclusion of noble metal ions, such as silver ions, in a coating (overcoat and/or overcoat) can lead to increased fusing of a fused metal nanostructured network to both lower the sheet resistance and improve thermal stability.

The sparse metal conductive layers are generally covered with a polymer overcoat to provide mechanical protection to the conductive layer. In some embodiments, it may be possible to select an overcoat such that after application of the overcoat, the haze is significantly reduced without significantly degrading other properties. Also, the thickness and compositions of the overcoat can be selected such that the sheet resistance measurement through the overcoat is not significantly altered relative to the measurement without the overcoat. The incorporation of additional stabilizers into coatings is described further below and in published U.S. patent application 2018/0105704 to Yang et al. (hereinafter the '704 application), entitled "Stabilized Sparse Metal Conductive Films and Solutions for Delivery of Stabilizing Compounds," incorporated herein by reference.

In some embodiments, the overcoat layer are generally thin enough so that electrical conductivity can take place through the overcoat, even though the overcoat polymers are generally dielectric. In other words, the surface with the overcoat should generally have roughly the same sheet resistance as the surface without the overcoat. To provide electrical conductivity through the polymer overcoat, it can be desirable for the polymer overcoat to have an average thickness of no more than about 250 nm, in some embodiments from about 5 nm to about 200 nm, in other embodiments from about 8 nm to about 125 nm, and in further embodiments from about 10 nm to about 100 nm. A person of ordinary skill in the art will recognize that additional ranges of thicknesses within the explicit ranges above are contemplated and are within the present disclosure.

As noted above, the conductive structure can comprise underlayers between the polymer substrate and the sparse metal conductive layer generally with a fused metal nanostructured network. An underlayer adjacent the transparent conductive layer can be called an undercoat. The undercoat can comprise a polymer hardcoat. As an undercoat, the polymer hardcoat does not provide mechanical protection, but a polymer hardcoat can provide protection from chemical assaults. In some embodiments, a polymer hardcoat undercoat provides significant stability for a fused metal nanostructured layer for some polymer substrates.

Suitable hardcoat polymers are generally highly crosslinked polymers with crosslinked polyacrylates that can be combined with other crosslinked moieties, such as polyurethanes, epoxy polymers, polysiloxanes and/or other crosslinked polymers. Branched acrylate monomers can provide for the formation of highly crosslinked polymers, and crosslinked acrylates can be copolymerized with other moieties, such as urethane acrylates, or the like to form intermeshed crosslinked polymers. Hardcoat polymers are commercially available, such as coating solutions from POSS® Coatings from Hybrid Plastics, Inc. (Mississippi, USA), silica filled siloxane coatings from California Hardcoating Company (California, USA), Acier® Hybrid Hard Coating Material from Nidek (Japan), SK1100 Series Hard Coat from Dexerials Corporation (Japan), Lioduras™ from TOYOCHEM (Japan), HC-5619 Hard Coat from Addison Clear Wave (IL, USA), CrystalCoat UV-curable coatings from SDC Technologies, Inc. (California, USA), and, Optoclear® from JSR Corporation (Japan). Hardcoat polymers are described further in published U.S. patent application 2016/0369104 to Gu et al., entitled "Transparent Polymer Hardcoats and Corresponding Transparent Films," incorporated herein by reference. Suitable hard coat polymers are available that are highly transparent for the relevant thicknesses such that the hardcoats do not significantly reduce the light transmission through the structure. Suitable crosslinking agents and additives are described for binders above, and these apply equally to coatings (for example, optional undercoat 104 and overcoat 108) without repeating the discussion explicitly here.

The structure after initial processing generally has a crosslinked overcoat that provide a relatively non-tacky surface. To protect the structure for shipping, storage or the like, one or both surfaces can be protected with a releasable polymer layer. The releasable polymer layer can be formed with a thickness from about 15 microns to about 200 microns, in further embodiments from about 20 microns to about 180 microns, in other embodiments from about 25 microns to about 170 microns and in additional embodiments from about 40 microns to about 150 microns. A person of ordinary skill in the art will recognize that additional ranges of thicknesses within the explicit ranges above are contemplated and are within the present disclosure. A range of suitable non-tacky polymers can be used for the polymer release layer, and the optical properties are not relevant since the release layers are removed for further processing. Suitable polymers include, for example, polyethylene, polypropylene, polyesters, polyamides, polysiloxanes, copolymers thereof, and the like. The particular polymers should be selected to have low tackiness, such that the peel strength of the release layer should be sufficiently low that the materials are not damaged when the release layer is peeled away from the substrate.

For the further post coating processing described herein for a roll-to-roll format, the release layer generally is present. The release layer can be selected to not become too tacky during the application of heat and humidity as selected for further processing. Following completion of any post coating processing, the prepared transparent conductive films can be used for assembly into devices, such as touch sensors, which can involve patterning and application of additional layers often with the use of optically clear adhesives, as described above.

Stabilization Compositions

An overcoat and/or undercoat can comprise stabilization compositions that provide improved stability of a fused metal nanostructured network, which can be evaluated using accelerated wear testing, for example, with heat and optionally with increased humidity. Previous work has found that vanadium (+5) compounds can be effective to provide desired stability. Others have found that iron (+2) and other metal salts can be effective stabilizers, see published U.S. patent application 2015/0270024A1, to Allemand entitled "Light Stability of Nanowire-Based Transparent Conductors," incorporated herein by reference. Also, cobalt (+2) ions complexed with ligands have been found to provide stabilization within a fused metal nanostructured network layer. The performance of these stabilization compositions alone or combined, can be enhanced through incorporation of noble metal ions, especially, silver ions within a coating (overcoat and/or undercoat) to further enhance the stability, possibly due to further fusing of the structure with migration of the metal ions. The benefits of the noble metal ions in a coating can be exploited similarly to the pentavalent vanadium during actual use of the structure in a product, although alternatively or additionally it may be beneficial to have the noble metal ions in the coating during a post deposition heat/humidity processing prior to assembly into a final product.

For incorporation into a coating, vanadium compounds with a +5 valance have been found to yield desirable stabilization under extended wear testing. Suitable compounds include compounds with the vanadium as a cation as well as compounds with vanadium as a part of a multi-atom anion, such as metavanadate ($VO_3^-$) or orthovanadate ($V_4^{-3}$). Corresponding salt compounds with pentavalent vanadium anions in an oxometalate include, for example, ammonium metavanadate ($NH_4VO_3$), potassium metavanadate ($KVO_3$), tetrabutylammonium vanadate ($NBu_4VO_3$), sodium metavanadate ($NaVO_3$), sodium orthovanadate ($Na_3VO_4$), other metal salts and the like, or mixtures thereof. Suitable penta-valent vanadium cation compounds include, for example, vanadium oxytrialkoxides ($VO(OR)_3$, R is an alkyl group, for example, n-propyl, isopropyl, ethyl, n-butyl, or the like, or combinations thereof), vanadium oxytrihalides ($VOX_3$ where X is Cl, F, Br or combinations thereof), vanadium complexes, such as $VO_2Z_1Z_2$, where $Z_1$ and $Z_2$ are independently ligands such as those described further below with respect to Co+2 complexes, or combinations thereof. In coatings, the penta-valent vanadium can be present, for example, from about 0.01 wt % to about 9 wt %, in further embodiments, from about 0.02 wt % to about 8 wt % and in additional embodiments from about 0.05 wt % to about 7.5 wt %. In a coating solution, the solution generally comprises some solvent along with the solids that primarily comprise a curable polymer. Generally, the corresponding coating solution can have the penta-valent vanadium compounds in concentrations from about 0.0001 wt % to about 1 wt %. A person of ordinary skill in the art will recognize that additional ranges of concentrations within the explicit ranges above are contemplated and are within the present disclosure. In additional or alternative embodiments, iron (+2) or other metal ions can be included in addition to or alternatively to the pentavalent vanadium ions.

Furthermore, noble metal ions, and in particular silver ions, can also be included in the solution for forming the coating. As used herein noble metal ions refer to ions of silver, gold, platinum, indium, osmium, ruthenium, and rhodium. The noble metal ions can be added as a suitable salt, such as nitrate, sulfate, perchlorate, hexafluorophosphate, hexafluoroantimonate, and halides. Suitable metal salts for providing the metal ions include, for example, chloroauric acid, palladium chloride. For silver salts, if the coating polymer is deposited with an alcohol or other non-aqueous organic solvent, suitable silver salts to obtain sufficient solubility include, for example, silver tetrafluoroborate ($AgBF_4$), silver hexafluorophosphate ($AgPF_6$), silver perchlorate ($AgClO_4$), silver hexafluoroantimonate ($AgSbF_6$), silver trifluoroacetate ($CF_3COO$), silver heptafluorobutyrate ($AgC_4HF_6O_2$, silver methylsulfonate ($AgCH_3SO_3$), silver tolylsulfonate ($AgCH_3C_6H_4SO_3$), or mixtures thereof. In coatings, the noble metal ions can be present, for example, from about 0.01 wt % to about 20 wt %, in further embodiments, from about 0.05 wt % to about 15 wt %, in other embodiments from about 0.1 wt % to about 12 wt %, in some embodiments from about 0.2 wt % to about 9 weight percent, and in additional embodiments from about 0.25 wt % to about 7.5 wt %. In a coating solution, the solution generally comprises some solvent along with the solids that primarily comprise a curable polymer. A person of ordinary skill in the art will recognize that additional ranges of concentrations within the explicit ranges above are contemplated and are within the present disclosure.

For use directly in a transparent conductive layer, especially with fused metal nanostructured networks, cobalt with a +2 valence has been found to be effective for stabilization without interfering with the fusing process. Suitable cobalt compounds include, for example, $Co(NO_3)_2$ with various complexing ligands, such as nitrite ($NO_2^-$), diethyl amine, ethylene diamine (en), nitrilotriacetic acid, iminobis(methylene phosphonic acid), aminotris(methylene phosphonic acid), ethylene diamine tetraacetic acid (EDTA), 1,3-propylenediaminetetraacetic acid (1,3-PDTA), triethylene tetramine, tri(2-aminoethyl) amine, 1,10-phenanthroline, 1,10-phenanthroline-5,6-dione, 2,2'-bipyridine, 2,2'-bipyridine-4,4'-dicarboxylic acid, dimethylglyoxime, salicylaldoxime, diethylenetriaminepentaacetic acid, 1,2-cyclohexanediaminotetraacetic acid, iminodiacetic acid, methyliminodiacetic acid, N-(2-acetamide) iminoacetic acid, N-(2-carboxyethyl) iminodiacetic acid, N-(2-carboxymethyl)imino dipropionic acid, picolinic acid, dipicolinic acid, histidine, combinations thereof. Cobalt ions have been previously suggested as a suitable ion source for fusing metal at nanowire junctions in the '833 application cited above. As shown in the '704 application, Co+2 actually destabilizes the transparent conductive film unless it is complexed with a ligand. With respect to the use of cobalt+2 stabilization compounds in the layer with the fused metal nanostructured network, the stabilization compounds would be added with a silver salt or other salt of a cation that would be much more readily reduced so that the cobalt+2 cations remain in the material following the fusing process. On the other hand, a stoichiometric amount of ligands for Co+2 has been found to interfere with the fusing process to form a fused nanostructured network. In the layer with the fused metal nanostructured network, the concentration of the cobalt+2 stabilization compounds can be from about 0.1 wt % to about 10 wt %, in further embodiments, from about 0.02 wt % to about 8 wt % and in additional embodiments from about 0.025 wt % to about 7.5 wt %. For the cobalt compositions to be effective without interfering with the fusing process, complexing ligands can be present in amounts from about 0.1 to about 2.6 ligand binding equivalents per mole cobalt, in further embodiments from about 0.5 to about 2.5 and in other embodiment from about 0.75 to about 2.4 ligand binding equivalents per mole cobalt With respect to equivalents, this terminology is intended to indicate that ligands that are multidentate have correspondingly molar ratios for the above ranges divided by their coordination number. With respect to the ink used to deposit the metal nanowires, the solution can comprise the cobalt+2 compounds in concentrations from about 0.0001 wt % to about 1 wt %, although further details of the nanowire inks are presented below. A person of ordinary skill in the art will recognize that additional ranges of concentrations within the explicit ranges above are contemplated and are within the present disclosure.

While a range of solutions for forming coatings can be used, in some embodiments, the solutions are based on organic solvents along with crosslinkable hardcoating precursors. Generally, the coating solution comprises at least about 7 wt % solvent, and in further embodiments from about 10 wt % to about 70 wt % solvent, with the remainder being non-volatile solids. In general, the solvents can comprise water, organic solvents or suitable mixtures thereof. Suitable solvents generally include, for example, water, alcohols, ketones, esters, ethers, such as glycol ethers, aromatic compounds, alkanes, and the like and mixtures thereof. Specific solvents include, for example, water, ethanol, isopropyl alcohol, isobutyl alcohol, tertiary butyl alcohol, methyl ethyl ketone, methyl isobutyl ketone, cyclic ketones such as cylcopentanone and cyclohexanone, diacetone alcohol, glycol ethers, toluene, hexane, ethyl acetate, butyl acetate, ethyl lactate, propylene carbonate, dimethyl carbonate, PGMEA (2-methoxy-1-methylethylacetate), N,N-dimethylformamide, N,N-dimethylacetamide, acetonitrile, formic acid, or mixtures thereof. In some embodiments, nonaqueous solvents can be desirable. The solvent selection generally is based to some degree on the hardcoat polymer coating composition. Suitable coating polymers are presented above. In general, the polymer for the coating, generally a crosslinkable polymer, can be supplied as a commercial coating composition or formulated with selected polymer compositions.

The polymer concentrations and correspondingly the concentrations of other non-volatile agents can be selected to achieve desired rheology of the coating solution, such as an appropriate viscosity for the selected coating process. Solvent can be added or removed to adjust total solid concentrations. Relative amounts of solids can be selected to adjust the composition of the finished coating composition, and the total amounts of solids can be adjusted to achieve a desired thickness of the dried coating. Generally, the coating solution can have a polymer concentration from about 0.025 wt % to about 70 wt %, in further embodiments from about 0.05 wt % to about 50 wt % and in additional embodiments from about 0.075 wt % to about 40 wt %. A person of ordinary skill in the art will recognize that additional ranges of polymer concentrations within the specific ranges above are contemplated and are within the present disclosure. The stabilization salt can be blended using appropriate mixing equipment into the polymer coating composition.

Post Coating Processing

The processing of the transparent conductive layer into a device generally involves several steps. After coating a nanowire solution onto a transparent substrate, the coating is dried under conditions to facilitate the fusing process. While the fusing is a thermodynamically driven process, some heating has been observed to provide for activation of the fusing process. The amount of fusing ions can be adjusted to result in complete fusing as indicated by an approximate plateau in the sheet resistance without a significant degradation of optical transmittance or haze, although an increase in color (increase in magnitude of b*) may be observed with fusing. The overcoat polymer layer is added over the transparent conductor layer after fusing. In a roll-to-roll format, which can be desirable from a commercial production standpoint, all of this processing is performed on a moving sheet forming the substrate, in which the coated structure is rolled up for further processing. Further processing may then performed based on the roll of coated product, although processing can be performed on a different format, such as sheets.

Evidence suggest that the further thermal processing involved the formation of additional fusing. The overall observations suggest that these processes have a longer time frame than the initial fusing. While not wanting to be limited based on theory of mechanism of operation, the overall observations suggest that some residual metal ion sources may gradually be consumed during the further processing to form additional metal at fused junctions. Swelling of the hydrophilic binder around the fused metal nanostructured network may facilitate the processing of the fused metal nanostructured network, which does not separate with the swelling of the polymer. The heat and humidity during the process can be used to control the processing, which both facilitate the further fusing as well as provide degradation pathways. As demonstrated in the examples, appropriate control of the process conditions can result in a lowering of sheet resistance and a slowing of the degradation pathways for transparent conductors based on fused metal nanostructured networks.

For this post coating processing, the temperatures of at least about 55° C., in further embodiments from about 60° C. to about 100° C., and in additional embodiments from about 70° C. to about 95° C. The humidity can be allowed to remain as the ambient humidity, but improved results are observed with increased levels of relative humidity. Due to the temperature increase, the relative humidity in the heated air resulting from only ambient humidity generally is a low value. In some embodiments, the relative humidity can be at least about 60%, in further embodiments at least about 65% and in other embodiments at least about 70%. The process time for stabilizing the fused metal nanostructured network can be at least about 10 minutes, in further embodiment a, form about 20 minutes to about 50 hrs, and in other embodiments from about 25 minutes to about 40 hrs. A person of ordinary skill in the art will recognize that additional ranges of temperature, relative humidity and process time within the explicit ranges above are contemplated and are within the present disclosure.

The processing with heat and optionally with enhanced humidity can be performed in a suitable controlled environment conditions. If humidity is not controlled, the environment can be exposed to the ambient air, and suitable structures can be ovens or other suitable heaters. Smaller samples can be processed in testing chambers designed for application of controlled temperature and pressure. Commercial testing apparatuses that provide for control of the heat and humidity include, for example, ESPEC Model BTL-433 Environmental Chamber (ESPEC Corp. North America, Inc. Hudsonville, MI, USA) or Thermotron SM-3.5-3800 Benchtop Environmental Chamber (Thermotron Inc., Holland, MI, USA). Larger controlled environment chambers are commercially available.

Generally, the processing can be performed in the coated film without assembly into a structure with additional layers, such as those used in forming the ultimate device. Also, accelerated wear testing in layered stack involve placement of additional layers. The heat and optional humidity processing generally may not be performed in a stack structure including adhesive layers, such as optically clear adhesives. The heat and humidity can destabilize the stack for commercial processing. Although some destabilization can be acceptable for sample testing, it generally may not be acceptable for product production. Thus, the processing for sheet resistance lowering and stabilization would generally be performed on the samples with an overcoat and potentially a release layer The heat with optional high relative humidity can be performed with the films in a roll format loaded onto a roll. As noted above, an overcoat can be covered with a release layer in the roll-to-roll format to provide a non-tacky surface to facilitate rolling and unrolling, and suitable release layers are described above. Since the rolls are generally formed immediately following production and since the heat treatments are performed for some time, the roll format can be particularly convenient for commercial production. After the heat treatment, the samples can be assembled into final products.

Transparent Film Electrical and Optical Properties

The transparent conductive layers, such as those with a fused metal nanostructured network, can provide low electrical resistance while providing good optical properties. Thus, the films can be useful as transparent conductive electrodes or the like. The transparent conductive electrodes can be suitable for a range of applications such as electrodes along light receiving surfaces of solar cells. For displays and in particular for touch screens, the films can be patterned to provide electrically conductive patterns formed by the film. The substrate with the patterned film, generally has good optical properties at the respective portions of the pattern.

Electrical resistance of thin films can be expressed as a sheet resistance, which is reported in units of ohms per square ($\Omega/\square$ or ohms/sq) to distinguish the values from bulk electrical resistance values according to parameters related to the measurement process. Sheet resistance of films can be generally measured using a four point probe measurement or another suitable process. In some embodiments, the fused metal nanowire networks can have a sheet resistance of no more than about 300 ohms/sq, in further embodiments no more than about 200 ohms/sq, in additional embodiments no more than about 100 ohms/sq and in other embodiments no more than about 60 ohms/sq. A person of ordinary skill in the art will recognize that additional ranges of sheet resistance within the explicit ranges above are contemplated and are within the present disclosure. Depending on the particular application, commercial specifications for sheet resistances for use in a device may not be necessarily directed to lower values of sheet resistance such as when additional cost may be involved, and current commercially relevant values may be for example, 270 ohms/sq, versus 150 ohms/sq, versus 100 ohms/sq, versus 50 ohms/sq, versus 40 ohms/sq, versus 30 ohms/sq, versus 20 ohms/sq or less as target values for different quality and/or size touch screens, and each of these values defines a range between the specific values as end points of the range, such as 270 ohms/sq to 150 ohms/sq, 270 ohms/sq to 100 ohms/sq, 150 ohms/sq to 20 ohms/sq and the like with 15 particular ranges being defined. Thus, lower cost films may be suitable for certain applications in exchange for modestly higher sheet resistance values. In general, sheet resistance can be reduced by increasing the loading of nanowires, but an increased loading may not be desirable from other perspectives, and metal loading is only one factor among many for achieving low values of sheet resistance.

For applications as transparent conductive films, it is desirable for the fused metal nanowire networks or other sparse metal conductive layers to maintain good optical transparency. In principle, optical transparency is inversely related to the loading with higher loadings leading to a reduction in transparency, although processing of the network can also significantly affect the transparency. Also, polymer binders and other additives can be selected to maintain good optical transparency. The optical transparency can be evaluated relative to the transmitted light through the substrate. For example, the transparency of the conductive film described herein can be measured by using a UV-Visible spectrophotometer and measuring the total transmission through the conductive film and support substrate. Transmittance is the ratio of the transmitted light intensity (I) to the incident light intensity ($I_o$). The transmittance through the film ($T_{film}$) can be estimated by dividing the total transmittance ($I_o$) measured by the transmittance through the support substrate ($T_{sub}$). ($T=I/I_o$ and $T/T_{sub}=(I/I_o)/(I_{sub}/I_o)=I/I_{sub}=T_{film}$). Thus, the reported total transmissions can be corrected to remove the transmission through the substrate to obtain transmissions of the film alone. While it is generally desirable to have good optical transparency across the visible spectrum, for convenience, optical transmission can be reported at 550 nm wavelength of light. Alternatively or additionally, transmission can be reported as total transmittance from 400 nm to 700 nm wavelength of light, and such results are reported in the Examples below. In general, for the fused metal nanowire films, the measurements of 550 nm transmittance and total transmittance from 400 nm to 700 nm (or just "total transmittance" for convenience) are not qualitatively different. In some embodiments, the film formed by the fused network has a total transmittance (TT %) of at least 80%, in further embodiments at least about 85%, in additional embodiments, at least about 90%, in other embodiments at least about 94% and in some embodiments from about 95% to about 99%. Transparency of the films on a transparent polymer substrate can be evaluated using the standard ASTM D1003 ("Standard Test Method for Haze and Luminous Transmittance of Transparent Plastics"), incorporated herein by reference. The TT % through the entire film includes lowering of transmittance due to the substrate and overcoats, and can sift the lower ends of the above ranges of transmittance from 1% to 10% and in some embodiments by 2.5% to 5%. A person or ordinary skill in the art will recognize that additional ranges of transmittance within the explicit ranges above are contemplated and are within the present disclosure. When adjusting the measured optical properties for the films in the Examples below for the substrate, the films have very good transmission and haze values, which are achieved along with the low sheet resistances observed.

The fused metal networks can also have low haze along with high transmission of visible light while having desirably low sheet resistance. Haze can be measured using a hazemeter based on ASTM D1003 referenced above, and the haze contribution of the substrate can be removed to provide haze values of the transparent conductive film. In some embodiments, the sintered network film can have a haze value of no more than about 1.2%, in further embodiments no more than about 1.1%, in additional embodiments no more than about 1.0% and in other embodiments from about 0.9% to about 0.2%. As described in the Examples, with appropriately selected silver nanowires very low values of haze and sheet resistance have been simultaneously achieved. The loading can be adjusted to balance the sheet resistance and the haze values with very low haze values possible with still good sheet resistance values. Specifically, haze values of no more than about 0.8%, and in further embodiments from about 0.4% to about 0.7%, can be achieved with values of sheet resistance of at least about 45 ohms/sq. Also, haze values of 0.7% to about 1.2%, and in some embodiments from about 0.75% to about 1.05%, can be achieved with sheet resistance values of from about 30 ohms/sq to about 45 ohms/sq. All of these films maintained good optical transparency. A person of ordinary skill in the art will recognize that additional ranges of haze within the explicit ranges above are contemplated and are within the present disclosure.

With respect to the corresponding properties of the multilayered films, the additional components are generally selected to have a small effect on the optical properties, and various coatings and substrates are commercially available for use in transparent elements. Suitable optical coatings, substrates and associated materials are summarized above. Some of the structural material can be electrically insulating, and if thicker insulating layers are used, the film can be patterned to provide locations where gaps or voids through the insulating layers can provide access and electrical contact to the otherwise embedded electrically conductive element. Some components of the ultimate device can be covered from view with an opaque or translucent covering to hide from view portions of the structure, such as connections through to the electrically conductive transparent elements. The covering can shield the conductive layer from light, but heats up due to light absorption, and cover tape and edges at the transition between transparent and covered regions can have stability issues that are addressed in the Examples.

Transparent Electrically Conductive Film Stability and Stability Testing

In use, it is desirable for the transparent conductive films to last a commercially acceptable time, such as the lifetime of the corresponding device. The stabilization compositions and structures described herein have this objective in view, and the properties of the sparse metal conductive layers, e.g., fused metal nanostructured networks, are sufficiently maintained. Some of the processing and corresponding evaluation mimics some aspects of accelerated aging testing. However, the accelerated aging testing generally uses a more layered structure to correspond more closely to a structure in an actual device, such as a display. It is believed that the qualitative trends are nevertheless very meaningful, although direct quantitative comparison with Applicant's earlier accelerated aging testing may not be robust.

EXAMPLES

Example 1—Processing with Heat and Humidity to Lower Sheet Resistance

This example demonstrates the performance of silver nanowire structures containing NanoGlue® fusing agent under various environmental conditions by measuring relative sheet resistance. In general, processing and compositions described in the Examples 1 and 2 did not significantly change the optical properties of the structures relative to those reported for these materials earlier.

Figure 4:
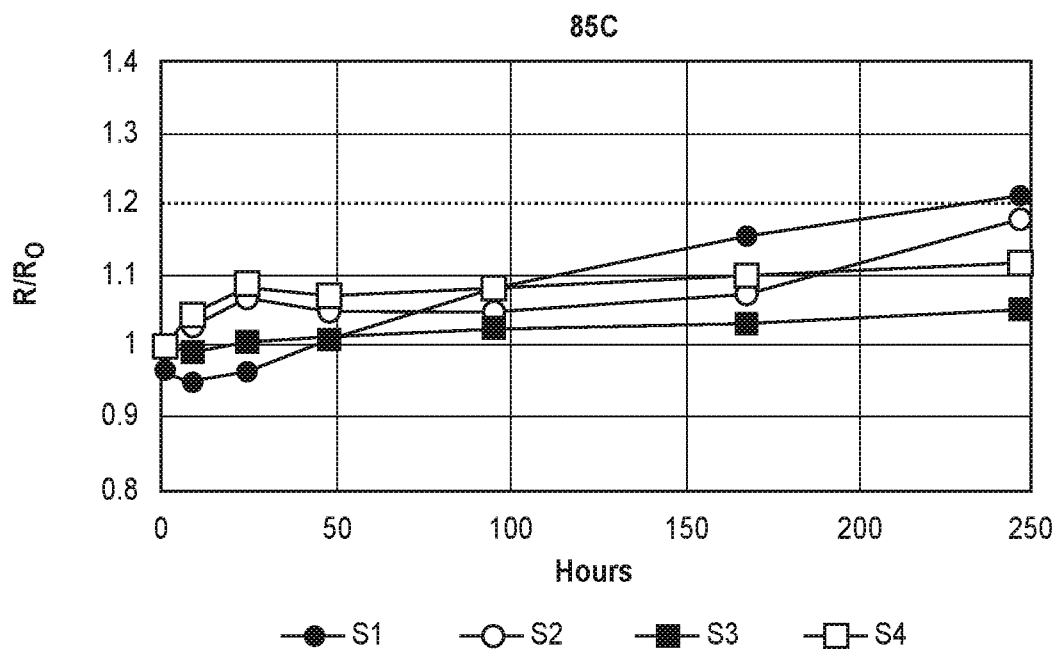
FIG. 4 is a plot of the relative sheet resistance as a function of processing time for a set of silver nanowire structure samples prepared by hand coating of silver nanowire inks having different levels of NanoGlue®. Samples were processed at 85° C.
Figure 5:
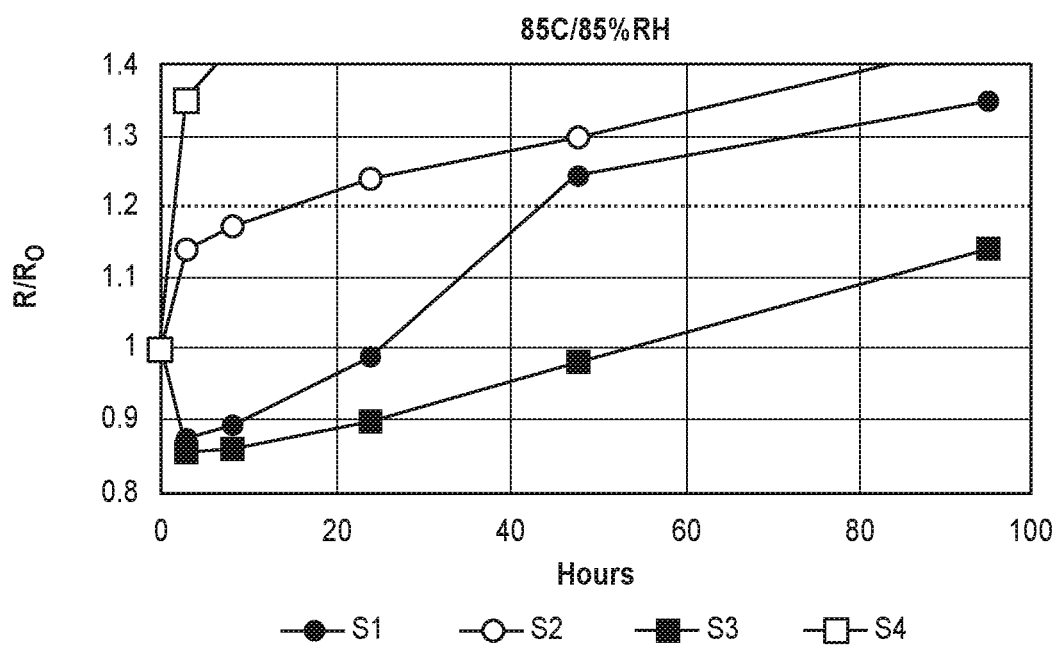
FIG. 5 is a plot of the relative sheet resistance as a function of processing time for a set of silver nanowire structure samples prepared by hand coating of silver nanowire inks having different levels of NanoGlue®. Samples were processed at 85° C. and 85% relative humidity.
Figure 6:
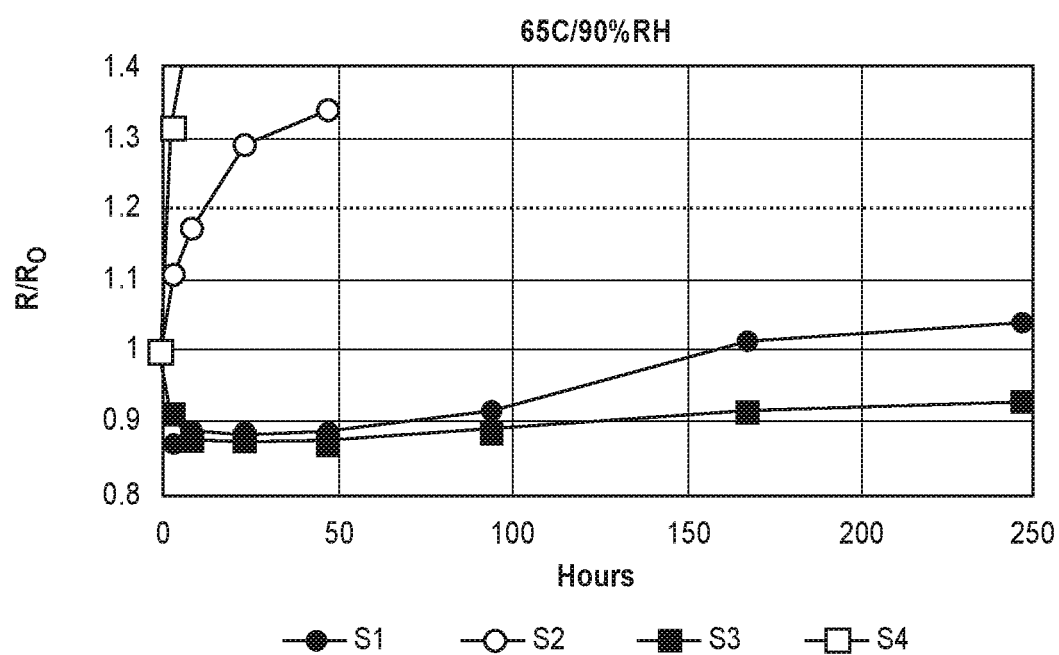
FIG. 6 is a plot of the relative sheet resistance as a function of processing time for a set of silver nanowire structure samples prepared by hand coating of silver nanowire inks having different levels of NanoGlue®. Samples were processed at 65° C. and 90% relative humidity.

Laboratory coating: FIGS. 4-6 show plots of the relative sheet resistance ($R/R_0$) as a function of time for samples in which transparent polymer substrates were coated with one of four silver nanowire ink compositions in a laboratory setting using a hand slot coating process. The first sample set (S1 and S2) was prepared with GEN5 ActiveGrid™ ink from Applicant C3Nano, Inc., with silver nanowires <25 nm in diameter, with one sample (S1) including a NanoGlue® fusing agent and the other sample (S2) with no fusing agent. The second sample set (S3 and S4) was prepared with GEN7 ActiveGrid™ ink, with silver nanowires <20 nm in diameter, one sample (S3) including a NanoGlue® fusing agent and the other sample (S4) with no fusing agent. The silver nanowires ink composition with NanoGlue® and processing to form the transparent conductive film was essentially as described in Example 5 of the '968 patent, cited above with silver nanowires synthesized as described in U.S. Pat. No. 10,714,230B2 to Hu et al., entitled "Thin and Uniform Silver Nanowires, Methods of Synthesis and Transparent Conductive Films Formed From the Nanowires," incorporated herein by reference.

After coating, the transparent conductive film structures were air dried at room temperature and then further baked in an oven at 120° C. for up approximately 2 minutes to induce fusing to form fused metal nanostructured networks. The amount of silver deposited was selected to provide films with roughly 70 ohms/sq sheet resistance, measured after drying. Over each dried transparent conductive film structure, a commercial overcoat was slot coated by hand. The overcoat was dried and crosslinked with a UV lamp to form an overcoat with a thickness of about 85 nm. The overcoat also included a stabilization compound as described in the '704 application cited above.

The effects of heat treatment or treatment with heat and humidity was studied using commercial testing apparatuses that provide for control of the heat and humidity. Samples were placed into the chamber and tested at various conditions of temperature (65° C. or 85° C.) and relative humidity (85%, 90%, or unregulated) without illumination. In contrast with conventional testing of metal nanowire based films, the samples were tested with just the polymer overcoat, which is in contrast to conventional testing, in which transparent conductive films are tested in a stack with additional thicker protective polymer layers.

The relative sheet resistance ($R/R_0$) of the samples as a function of time was measured. FIG. 4 shows the data for the condition of 85° C. with no humidity adjustment; FIG. 5 shows the data for the condition of 85° C. and 85% relative humidity; FIG. 6 shows the data for the condition of 65° C. and 90% relative humidity. The transparent conductive films formed from the thinner silver nanowires and NanoGlue® fusing agent, sample S3, showed the lowest relative sheet resistance at the longest testing times for teach condition, indicating the highest long-time stability performance. Comparing FIG. 4 with FIGS. 5 and 6, it is seen that dry heating at 85° C. did not increase the sheet resistance significantly, but the elevated humidity caused large sheet resistance increases. Comparing FIGS. 4 and 5 with FIG. 6, the superior performance of the samples with NanoGlue® fusing agent (S1 and S3) at conditions of high relative humidity (90%) was clearly evident, especially for times greater than 50 hours. The stabilizing effect of the NanoGlue® fusing agent was especially pronounced for the lower diameter nanowire structures at elevated relative humidity, as seen by dramatically different results for S3 and S4, in FIGS. 5 and 6. Thinner silver nanowire has more surface to volume ratio, and the observed effect of NanoGlue® in the S3 and S4 samples may be due to the increased contact number and reduced contact area for the thinner wires.

Processing at 85° C. and 85% relative humidity (FIG. 5) provided the largest initial decrease in the relative sheet resistance. In each of the environmental conditions, the sheet resistance dropped (about 10% or more) in the initial hours of testing for the samples with NanoGlue® in the coatings (S1 and S3). With the exception of S1 in the 85° C. with no humidity adjustment environment after about 75 hours (FIG. 4), the samples with the NanoGlue® fusing agent showed lower relative sheet resistance at a given time of testing than the samples without the fusing agent. The samples formed without the NanoGlue® fusing agent (S2 and S4) did not exhibit any decrease in relative sheet resistance with processing. In these samples, the relative sheet resistance only increased with time.

Figure 7:
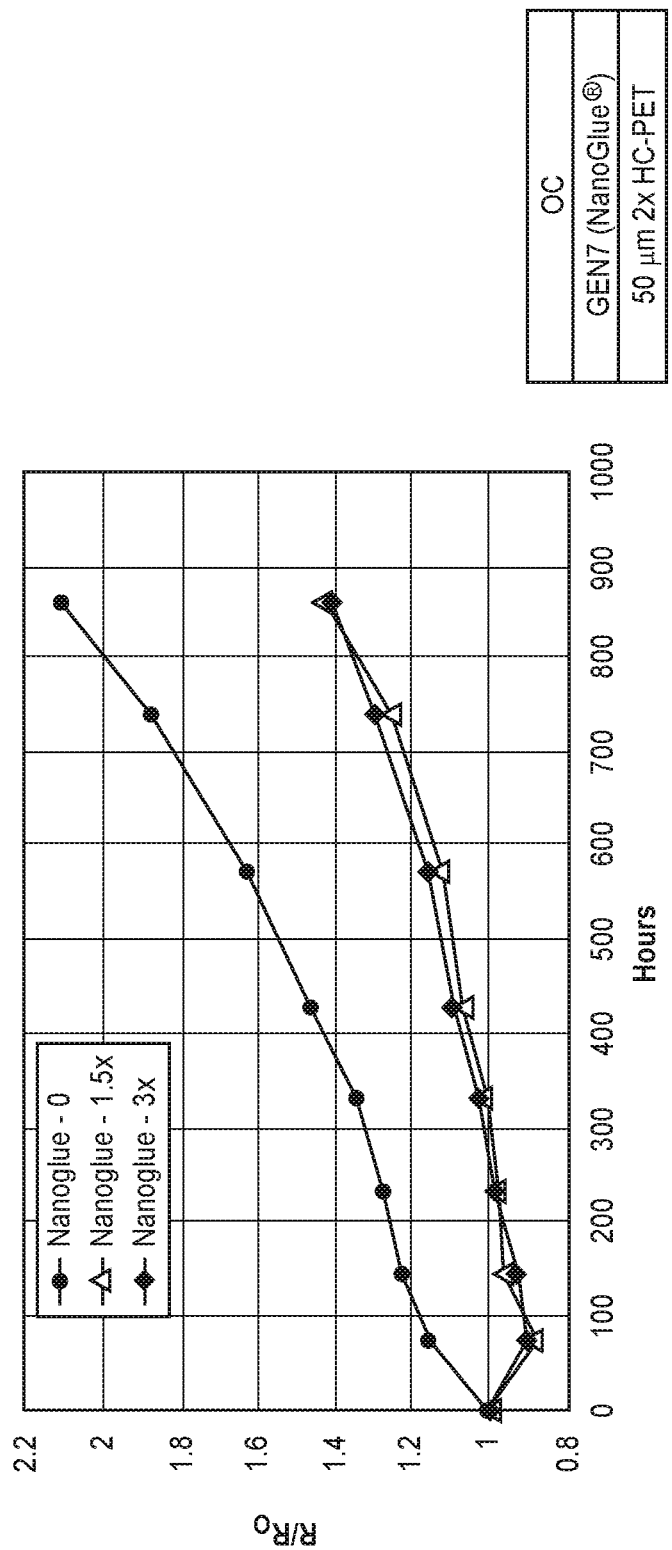
FIG. 7 is a plot of the relative sheet resistance as a function of processing time for a set of silver nanowire structure samples prepared by roll-to-roll coating of silver nanowire inks having different levels of NanoGlue®. Samples were processed at 65° C. and 90% relative humidity.

Roll-to-Roll Coating: FIG. 7 shows the results of the samples in which substrates were coated with one of three silver nanowire ink compositions using slot-die coating in a roll-to-roll format. The three silver nanowire ink compositions were prepared with GEN7 ActiveGrid™ ink and different amounts of NanoGlue® fusing agent: 1.5× NanoGlue®, 3× NanoGlue® or no NanoGlue® (as a control) in which the amount of NanoGlue® is referenced relative to the standard amount in the commercial inks. After coating, the structures air dried at room temperature and then further were dried in an oven at 120° C. for up to 10 minutes to dry the inks. The resistance of the nanowire ink coated samples as a function of time was tested in an air atmosphere at 65° C. and 90% relative humidity. The two samples coated with NanoGlue® containing inks exhibited an initial drop in relative sheet resistance of roughly 10% at about 80 hours. After the initial drop, the relative sheet resistance for the samples coated with NanoGlue® increased, but remained below the initial resistance value until about t=300 hours. The final relative sheet resistance ($R/R_0$) for the two samples with NanoGlue® fusing agent was 1.4. The 1.5× NanoGlue® sample generally showed lower sheet resistance than the 3× sample. The sample with no fusing agent exhibited an initial increase of sheet resistance of about 19% and subsequently increasing sheet resistance throughout the testing period. The final relative sheet resistance was about 2.1. A target limit of 1.2 $R/R_0$ for sheet resistance increase is shown with a horizontal line.

This experiment showed that nanowire inks with either 1.5× or 3× NanoGlue® fusing agent reduced the resistance of nanowire coated structures by about 33%. The sample without NanoGlue® crossed the 1.2 target after about 125 hours, while the samples with NanoGlue® crossed the 1.2 target limit after about 650 hours.

The lab and roll-to-roll results showed that the environmental durability of conductive silver nanowire films was improved by the use of NanoGlue® fusing agent. The results suggest that the initial resistance drop observed in the NanoGlue® samples is an indication that the NanoGlue® is providing an additional metal source to the transparent conductive film. The improved stability observed at high temperature/high humidity conditions with the NanoGlue®, is consistent with fusing that reduces/eliminates junction resistances which may increase more rapidly under the high temperature/high humidity conditions if not fused. These result indicate that an initial heat and humidity treatment of coated products can be used to reduce the sheet resistance and likely the stability of transparent conductive films prior to assembly into devices.

Example 2—Stabilizing Fused Metal Nanostructured Network with Silver Ions in Overcoat This example shows the stabilizing effect of NanoGlue® fusing agent in an overcoat layer adjacent a fused metal nanostructured network.

Figure 8:
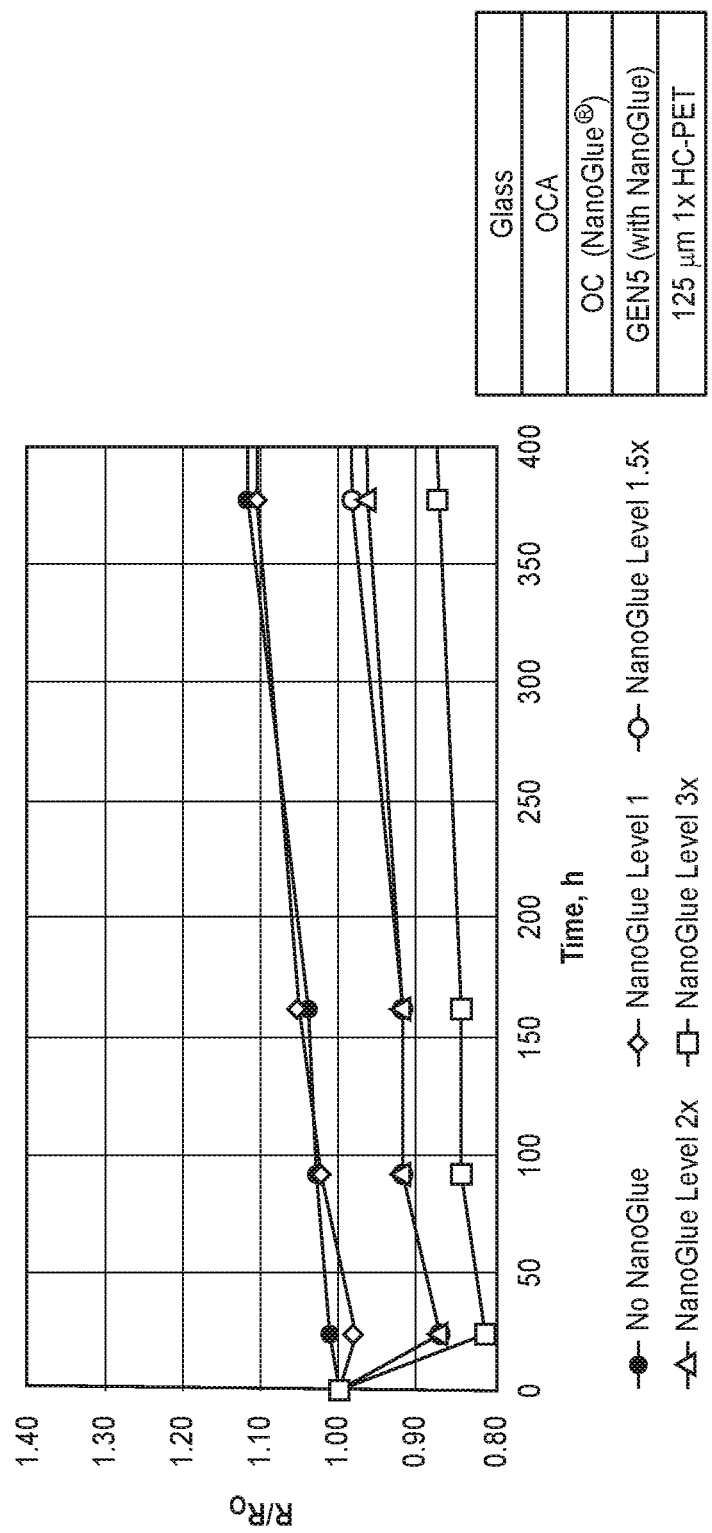
FIG. 8 is a plot of the relative sheet resistance as a function of processing time for a set of stacked optical structure samples prepared with silver nanowire inks containing NanoGlue® and provided with overcoats having different levels of NanoGlue®. Samples were processed at 85° C. and 85% relative humidity.

FIG. 8 shows a plot of the relative sheet resistance ($R/R_0$) as a function of time for stacked optical structure samples provided with various overcoats. The structures included a transparent polymer substrate with a sparse metal conductive layer that is either fused to form a sparse metal nanostructured network or unfused, and the formation of this structure is described in Example 1. The layers of the stacked optical structure samples are illustrated in FIG. 8. Each sample had a PET substrate. The substrate was coated with a GEN5 silver nanowire ink with NanoGlue® fusing agent and then dried, as described in Example 1. Next, an overcoat consisting of UV-curable polymer resin containing a selected amount of silver salt (as NanoGlue®) was coated onto each structure. Finally, each structure was provided with a stack on A-type glass. The five overcoat compositions were prepared with different amounts of NanoGlue® fusing agent: NanoGlue® Levels 1×, 1.5×, 2×, 3×, or no Nano- Glue® (as a control), where the reference amount of Nano-Glue® (1×) is from about 3.0 wt % to about 3.5 wt % silver ions. The samples were tested at high temperature/high humidity conditions: 85° C. and 85% relative humidity. Each of the samples having an overcoat with NanoGlue® showed an initial decrease in the relative sheet resistance, with the decrease being more pronounced with increasing levels of NanoGlue®. The NanoGlue® in the overcoat showed an obvious effect on the sheet resistance of the silver nanowire structure upon further high temperature/high humidity treatment of the optical stack structure.

This example shows that in structures with both overcoats and silver nanowire layers containing NanoGlue®, the decrease in sheet resistance upon the high temperature/high humidity treatment can be even more profound. For example, comparing S1 of FIG. 5 to NanoGlue® Level 3× of FIG. 8 at about 95 hours, the samples have relative sheet resistances of 1.07 and 0.85, respectively. This reduction in sheet resistance is consistent with the chemical reduction of the silver ions in the overcoat to metal silver conductor at junction locations.

Figure 9:
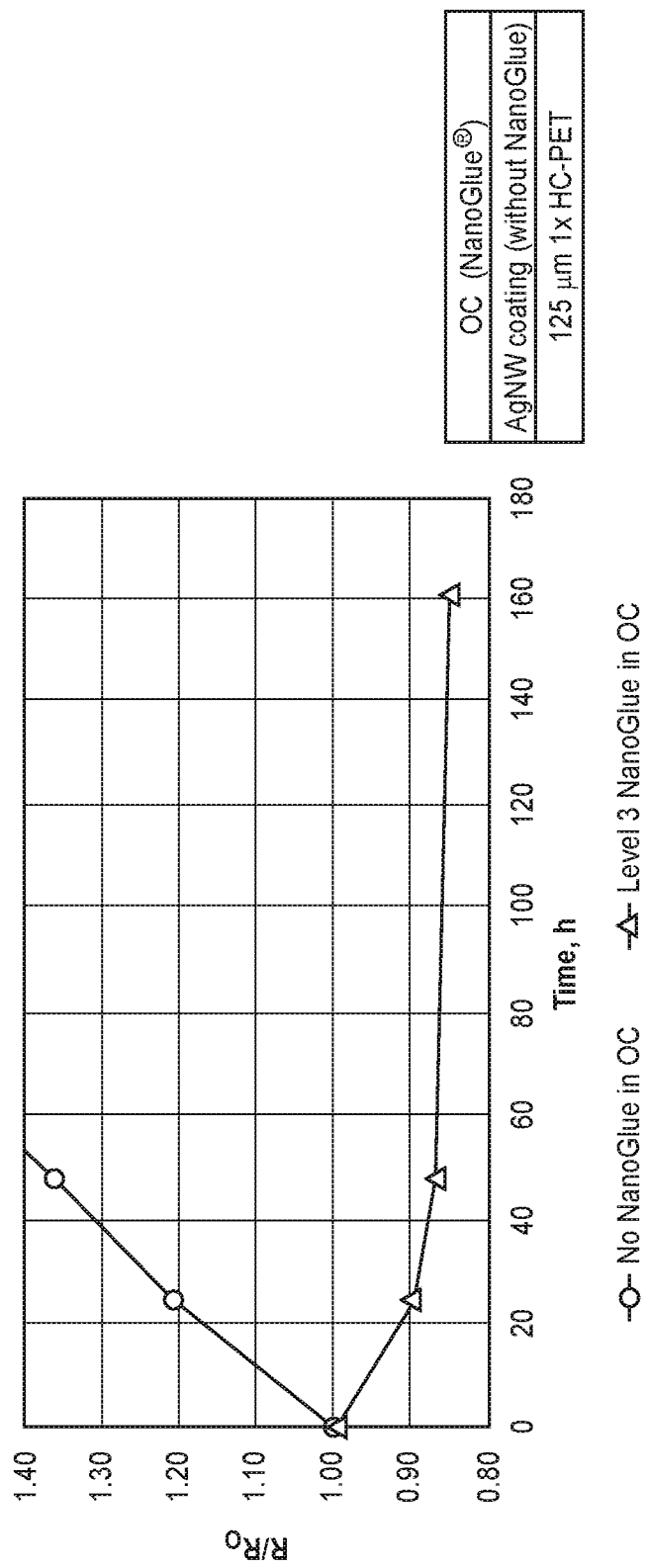
FIG. 9 is a plot of the relative sheet resistance as a function of processing time for two stacked optical structure samples prepared with silver nanowire inks (without NanoGlue®) and overcoats with or without NanoGlue®. Samples were processed at 85° C. and 85% relative humidity.

FIG. 9 shows the effect of NanoGlue® Level 3× in the overcoat on a GEN5 silver nanowire film without Nano-Glue® in which a stack is tested with only the polymer overcoat and not additional OCA or other layers. A sample with NanoGlue® in the overcoat and another sample without NanoGlue® in the overcoat are shown for a high temperature/high humidity condition of 85° C. and 85% relative humidity. The sample with the NanoGlue® in the overcoat showed an initial decrease in relative sheet resistance, followed by a continued decrease. In contrast, the sample without NanoGlue® in the overcoat showed a pronounced increase. At about 45 hours, the two samples were at 0.87 versus 1.36.

This Example shows that NanoGlue® in the overcoat, with or without NanoGlue® in the silver nanowire layer, can significantly lower sheet resistance and provide significant stabilization under accelerated wear testing.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understand that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated. The use of the term "about" herein refers to expected uncertainties in the associated values as would be understood in the particular context by a person of ordinary skill in the art.

What is claimed is:

1. A transparent conductive film comprising a transparent polymer substrate, a sparse metal conductive layer supported by the substrate, and a polymer overcoat adjacent the sparse metal conductive layer, wherein the transparent conductive film has a transmittance of visible light of at least about 88% and a sheet resistance of no more than about 120 ohm/sq and wherein the polymer overcoat comprise polymer and from about 0.01 wt % to about 20 wt % noble metal ions wherein the noble metal ions comprise ions of silver, gold, platinum, indium, osmium, ruthenium or rhodium.

2. The transparent conductive film of claim 1 wherein the overcoat has an average thickness from about 5 nm to about 250 nm.

3. The transparent conductive film of claim 1 wherein the polymer of the overcoat comprises comprises a polysiloxane, a polysilsesquioxane, a polyurethane, an acrylic resin, an acrylic copolymer, a cellulose ether and/or ester, nitrocellulose, other water insoluble structural polysaccharide, a polyether, a polyester, polystyrene, polyimide, fluoropolymer, a styrene-acrylate copolymer, a styrene-butadiene copolymer, an acrylonitrile butadiene styrene copolymer, polysulfide, an epoxy containing polymer, copolymers thereof, and mixtures thereof.

4. The transparent conductive film of claim 1 wherein the polymer overcoat comprises from about 0.1 wt % to about 9 wt % of a vanadium (+5) stabilization composition.

5. The transparent conductive film of claim 1 wherein the polymer overcoat has an average thickness from about 10 nm to about 125 nm, wherein the polymer of the overcoat comprises polyacrylate, and wherein the polymer overcoat further comprises from about 0.5 wt % to about 5 wt % of a vanadium (+5) stabilization composition that comprises ammonium metavanadate ($NH_4VO_3$), tetrabutylammonium vanadate ($NBu_4VO_3$), potassium metavanadate ($KVO_3$), sodium metavanadate ($NaVO_3$), sodium orthovanadate ($Na_3VO_4$), vanadium oxytripropoxide, vanadium oxytriethoxide, vanadium oxytriisopropoxide, vanadium oxytributoxide, or mixtures thereof.

6. The transparent conductive film of claim 1 wherein the sparse metal conductive structure comprises a fused metal nanostructured network comprising silver and wherein the noble metal ions comprise silver ions.

7. The transparent conductive film of claim 1 wherein the transparent conductive film has a transmittance of at least about 90% and a sheet resistance of no more than about 90 ohm/sq.

8. The transparent conductive film of claim 1 wherein the polymer overcoat comprise from about 0.25 wt % to about 12 wt % silver ions that are provided as silver tetrafluoroborate ($AgBF_4$), silver hexafluorophosphate ($AgPF_6$), silver perchlorate ($AgClO_4$), silver hexafluoroantimonate ($AgSbF_6$), silver trifluoroacetate ($AgCF_3COO$), silver heptafluorobutyrate ($AgC_4HF_6O_2$,) and silver methylsulfonate ($AgCH_3SO_3$), silver tolylsulfonate ($AgCH_3C_6H_4SO_3$), or mixtures thereof.

9. The transparent conductive film of claim 1 wherein the sparse metal conductive layer is patterned.

* * * * *